US005385883A

United States Patent [19]

Lenzing et al.

[11] Patent Number: 5,385,883

[45] Date of Patent: Jan. 31, 1995

[54] HIGH $T_c$ SUPERCONDUCTING MICROSTRIP PHASE SHIFTER HAVING TAPERED OPTICAL BEAM PATTERN REGIONS

[75] Inventors: Erik H. Lenzing, Middletown; Charles D. Hechtman, Hopewell, both of N.J.

[73] Assignee: The United States of America as represented by the Secretary of the Army, Washington, D.C.

[21] Appl. No.: 64,383

[22] Filed: May 17, 1993

[51] Int. Cl.[6] ........................ H01P 1/18; H01B 12/00; H01L 39/00

[52] U.S. Cl. .................................... 505/182; 505/210; 505/700; 505/701; 505/866; 333/99.005; 333/161

[58] Field of Search .................... 333/995, 161; 505/1, 505/700, 701, 866, 210, 181, 182

[56] References Cited

U.S. PATENT DOCUMENTS

| | | | |
|---|---|---|---|
| 4,675,624 | 6/1987 | Rosen et al. | 333/161 |
| 5,116,807 | 5/1992 | Romanofsky et al. | 333/995 X |
| 5,208,213 | 5/1993 | Ruby | 333/995 X |
| 5,258,626 | 11/1993 | Suzuki et al. | 505/701 X |
| 5,285,067 | 2/1994 | Culbertson et al. | 505/866 X |

FOREIGN PATENT DOCUMENTS

| | | | |
|---|---|---|---|
| 9300720 | 1/1993 | WIPO | 333/995 |

OTHER PUBLICATIONS

Glass, N. E. and Rogovin, D.; "Optical Control of Microwave Propagation in Superconducting Devices"; *Applied Physics Letters;* vol. 54, No. 2; 9 Jan. 1989; pp. 182-184.

*Primary Examiner*—Benny T. Lee
*Attorney, Agent, or Firm*—Michael Zelenka; William H. Anderson

[57] ABSTRACT

The present invention is a superconducting opto-electronic phase shifter which is achieved by illuminating a superconducting microstrip line, which is fabricated on a dielectric substrate, with an optical beam of a predetermined intensity and shape. Because the superconducting microstrip will exhibit a local surface resistance when and where illuminated, the microstrip line will be artificially narrowed thereby producing a phase shift. This occurs because as the width of a superconducting microstrip line narrows the velocity of the carder signal increases. Therefore, if the illumination of the superconducting microstrip line causes a local surface resistance, then the surface impedance of the microstrip line is increased causing the effective width of the microstrip line to decrease. Hence, the artificial decrease in the width of the microstrip will cause the phase of the carrier signal to shift.

6 Claims, 1 Drawing Sheet

HIGH $T_c$ SUPERCONDUCTING MICROSTRIP PHASE SHIFTER HAVING TAPERED OPTICAL BEAM PATTERN REGIONS

GOVERNMENT INTEREST

The invention described herein may be manufactured, used and/or leased by, or on behalf of, the Government of the United States of America without the payment to us of any royalties thereon.

FIELD OF THE INVENTION

The present invention generally relates to the field of microwave and millimeter wave electronic devices, more particularly to such devices which utilize superconducting microstrip lines to control the phase of a guided microwave/millimeter wave carrier signal.

BACKGROUND OF THE INVENTION

To date, applications of low temperature superconductors in optoelectronics have been very limited and have been primarily constrained to uses in infrared and microwave detectors. The primary reason for not utilizing superconducting electrodes and transmission lines in semiconductor based optoelectronics is because the incorporation of superconducting elements in such devices would require the operation of the devices at liquid helium temperatures. As those skilled in the art recognize, the other semiconducting elements necessary for operation of such optoelectronic devices usually do not work properly at these temperatures and further, the high cost of refrigeration does not make the incorporation of superconducting elements into semiconducting optoelectronic devices cost effective.

In contrast to low temperature superconductors, it has been documented that when a direct current which is near a superconducting material's critical current level, $J_c$, is applied to a superconducting stripline, the superconducting stripline exhibits a local sensitivity to optical illumination. This reaction manifests itself as a local surface resistance. As reported in, "Microwave Detection and Mixing in Y-Ba-Cu-O Thin Films at Liquid-Nitrogen Temperatures," *Journal of Applied Physical Letters*, Vol. 53(9), August 1988, this response to optical illumination can be as fast as 40 picoseconds. To date, however, the use of high temperature superconductors has also been limited to applications in infrared and microwave detectors.

Further, it is documented that high temperature superconducting material, which is cooled to below its transition temperature, has also been utilized in several microstrip line applications due to its characteristic low surface impedance. Some examples of these applications of high temperature superconductors are further described in publications such as, "Picosecond Pulses on Superconducting Striplines," Kautz, *Journal of Applied Physics*, Vol. 49(1), 1978 and "Principles of Superconducting Devices and Circuits," Van Duzer et at, *Elsevier Press*, New York, 1981. Generally, the characteristic impedance and phase velocity of these high temperature superconductors may be described as a function of the stripline width for a given dielectric substrate thickness. The effect of this relation is such that the velocity of the carrier signal will decrease if the stripline is made wider and likewise, the velocity of the carrier signal will increase if the stripline is made narrower. As those skilled in the art readily recognize, this effect may translate into a myriad of different applications and uses.

The use of high temperature superconductors, however, has yet to have been disclosed in fully monolithic devices, i.e. where the entire optoelectronic element is made entirely of a high temperature superconductor. The present invention addresses such an application.

SUMMARY OF THE INVENTION

Accordingly, one objective of the present invention is provide for a simple, small and lightweight device to control microwave signals.

Another objective of the present invention is provide such a device which utilizes an optical signal to shift the phase of a carrier signal traveling through a high temperature superconducting microstrip line.

These and other objects of the present invention are achieved by illuminating a superconducting microstrip line, which is fabricated on a dielectric substrate, with an optical beam of a predetermined intensity and shape. Because the superconducting microstrip will exhibit a local surface resistance when and where illuminated, the microstrip line will be artificially narrowed thereby producing a phase shift. This occurs because as the width of a superconducting microstrip line narrows the velocity of the carrier signal increases. Therefore, if the illumination of the superconducting microstrip line causes a local surface resistance, then the surface impedance of the microstrip line is increased causing the effective width of the microstrip line to decrease. Hence, the artificial decrease in the width of the microstrip will cause the phase of the carder signal to shift.

In a preferred embodiment of the present invention, two elliptical optical beams illuminate both sides of the microstrip line. This shaping of the optical beams will provide for an impedance matching as well as minimize the reflection losses of the carrier signal.

In another preferred embodiment, the optical devices utilized to manipulate the optical beams have a diffraction grating which produces an optical pattern that can be modified by variations in light frequency. This embodiment, then, could produce a transducer capable of adaptively creating any transmission characteristic required.

DETAILED DESCRIPTION OF THE INVENTION

Figure 1:
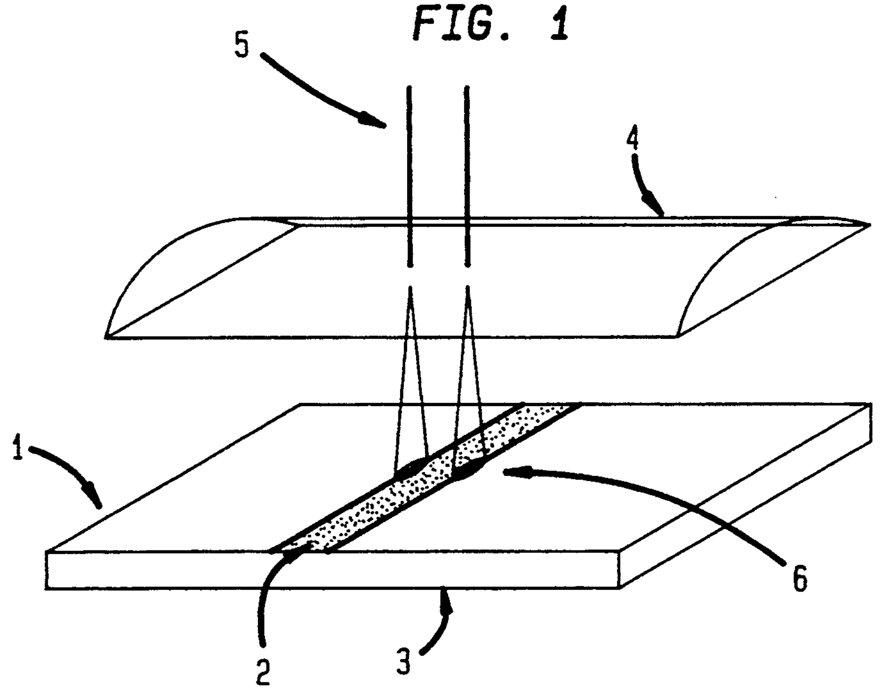
FIG. 1 is a perspective view of one embodiment of the present invention.

Referring now to FIG. 1, there is shown a perspective view of one embodiment of the present invention. As shown, a dielectric substrate 1 is formed on a ground plane 3 and a superconducting thin film microstrip line 2 is deposited on top of the dielectric substrate 1.

Also as shown in FIG. 1, a means to a apply an optical beam of predetermined shape and intensity is mounted over the superconducting microstrip line. This optical beam application means can be any combination of light source 5 and lens 4. In the preferred embodiment, however, the optical beam shape 6 is that of an ellipse and two such beams are positioned so as to illuminate either side of the superconducting microstrip line.

The superconducting material must be made of a material that when a current near to the material's critical current level, $J_c$, is applied, the material exhibits local surface resistance when illuminated. One preferred example of a material that exhibits this quality is a Yttrium Barium Copper Oxygen (YBaCuO) based material. The most commonly referenced chemical composition of this material is $YBa_2Cu_3O_{7-y}$, where $0<y\leqq 0.1$; these materials exhibit metallic-type transport properties at room temperature and show a superconducting transition at $T_c=91$ K. Of course, other oxygen-deficient perovskites or even other YBaCuO materials where y is another value than the example given may also be utilized in the present invention. Examples of some other high temperature superconducting materials include $Tl_2Ba_2Ca_2Cu_3O_x$, $Bi_{2-x}Pb_xSr_2Ca_2Cu_3O_{10+y}$, and $Li_xBi_2Sr_2CaCu_2O_{8+y}$. The substrate material is usually made of $LaAlO_3$ and is typically on the order of 20 mils thick. Examples of other substrate materials include $SrTiO_3$ as well as various other metallic substrates.

An example of a method of manufacturing such a material is described in Pat. No. 5,140,002, entitled, "Photoconductive-substance of the Y-Ba-Cu-O System and a Method of Producing the Same," and issued to Masumi on Aug. 18, 1992, which is incorporated herein by reference. The YBCO may be deposited on the substrate using processes known in the art. Generally, two such processes that are used include: an ex-situ process in which Y, Ba, and Cu are deposited with the correct stoichiometry by coevaporation of $BaF_2$, Y and Cu followed by a post deposition annealing, typically at 850° C., in flowing $O_2$ containing water vapor; and an in-situ growth process using off-axis single target sputtering with temperatures typically between 650° and 750° C. As those skilled in the an will readily recognize other superconducting materials and substrates may also be utilized for this invention.

As shown in FIG. 1, superconducting microstrip line may then be patterned by etching the superconducting microstrip line as depicted. The patterning of the superconducting microstrip line may be accomplished with standard photoresists and known masking techniques. A spray etch may also be used to prevent the formation of a residual film typically found with most other wet etch methods.

As those skilled in the an will readily appreciate, a high temperature superconductor microstrip line operating in a superconducting state and without optical illumination has an associated characteristic impedance and phase velocity. See Kautz, "Picosecond pulses on superconducting striplines," *Journal of Applied Physics* 49(1), January, 1978; and Van Duzer et al, "Principles of Superconductive Devices and Circuits," *Elsevier Press*, New York, 1981. The impedance and phase velocity are a function of the microstrip line width given a predetermined dielectric and dielectric thickness. As a result of this relation, the phase velocity will decrease if the microstrip line is made wide and will increase if the line is made more narrow. This change in phase velocity, therefore, will equate to a change in the total phase over a given length of microstrip fine.

Also, as those skilled in the art will appreciate, the effective width of the microstrip line can be altered due to a change in surface resistance or an increase in the real part of the surface impedance. Therefore, because superconducting thin films that are DC biased to its superconducting critical current level, $J_c$, exhibit local sensitivity to optical illumination which manifests itself as a local surface resistance, a phase shifter may be formed by illuminating the microstrip line with an optical patterning means.

In operation and as depicted in FIG. 1, superconducting stripline 2 is biased with a current that is near to the superconducting stripline's critical current level, $J_c$, and the optical shaping means is used to illuminate the surface of the superconducting strip line. In the preferred embodiment, the optical shaping means comprises a light source 5 and a lens 4 to shape the optical signal in the form of two ellipses 6. The beam pattern shown is formed to provide a gradual transition from the unilluminated microstrip line width. This provides a proper impedance matching and will minimize the reflection losses of the devices. Preferably, the optical beam pattern is in the shape of two ellipses half of the ellipses being directed to each side of the microstrip line as shown.

Figure 2:
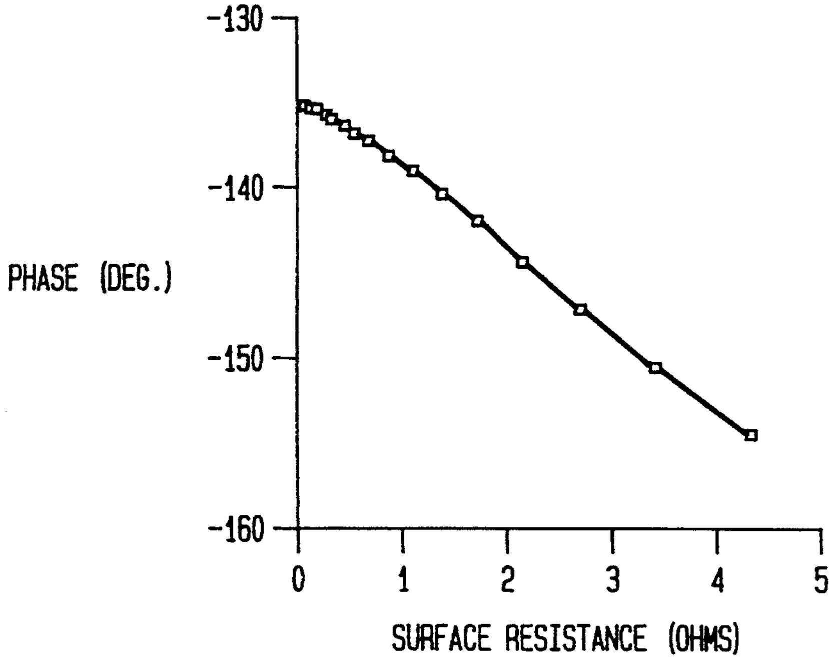
FIG. 2 is a graphical representation of the variation of insertion phase as a function of surface resistance produced by the illumination of the superconducting microstrip line employed in the present invention.

The results of a test showing the principle of the present invention are shown in FIG. 2. The plot shows the variation in insertion phase for variations in surface resistance of 0 to 5 ohms. This test was done on a phase shifter with an illuminated area of approximately 0.8 millimeter. This area, of course, could be increased for larger shifts with no decrease in transmission magnitude.

Given this disclosure then, those skilled in the art will appreciate that the optical patterning may be configured to establish a myriad of opto-electronic devices while still maintaining the monolithic structure of the superconducting microstrip line. Moreover, the microstrip line can be configured using the principles disclosed herein.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

What is claimed is:

1. A phase shifter comprising:

a dielectric substrate with a predetermined composition and thickness;

a superconducting microstrip line disposed on the dielectric substrate, the superconducting microstrip line having at least two opposites sides, an input end and an output end, and being of a predetermined composition, width, and thickness; and an optical beam patterning means positioned over the superconducting microstrip line such that the optical beam patterning means can illuminate predetermined tapered portions of the superconducting microstrip line with an optical beam between the input end and the output end of the superconducting microstrip line;

wherein the superconducting microstrip line is biased and cooled to a superconducting critical current and wherein a local resistivity is established in the superconducting microstrip line at the predetermined tapered portions when illuminated by the optical beam patterning means.

2. The phase shifter of claim I wherein the dielectric substrate is comprises of $LaAlO_3$.

3. The phase shifter of claim 2 wherein the superconducting microstrip is comprised of an oxygen deficient perovskite material.

4. The phase shifter of claim 3 wherein the superconducting microstrip is comprised of a material of the composition $YBa_2Cu_3O_{7-y}$, where y is greater than 0 but less than or equal to 0.1.

5. The phase shifter of claim 4 wherein the optical beam patterning means comprises a laser which is optically coupled to a lens of predetermined shape.

6. The phase shifter of claim 5 wherein the predetermined tapered portions of the superconducting microstrip that are illuminated are in the shape of two half ellipses, one the two half ellipses is positioned on one of the two opposite sides of the superconducting microstrip line and the other of the two half ellipses is positioned on the other of the two opposite sides of the superconducting microstrip line, both of the two half ellipses being respectively positioned between the input end and the output end of the superconducting microstrip line.

* * * * *

UNITED STATES PATENT AND TRADEMARK OFFICE

CERTIFICATE OF CORRECTION

PATENT NO. : 5,385,883

DATED : January 31, 1995

INVENTOR(S) : ERIK H. LENZING and CHARLES D. HECHTMAN

It is certified that error appears in the above-identified patent and that said Letters Patent is hereby corrected as shown below:

On the Title page under Abstract:

line 10, change "carder" to --carrier--;

Column 3, line 49, change "an" to --art--;

Column 3, line 64, change "fine" to --line--.

Signed and Sealed this

Thirtieth Day of May, 1995

Attest:

Bruce Lehman

BRUCE LEHMAN

*Attesting Officer* *Commissioner of Patents and Trademarks*